United States Patent [19]

Nakayama et al.

[11] Patent Number: 4,587,440
[45] Date of Patent: May 6, 1986

[54] WAVEFORM SHAPING CIRCUIT INCLUDING I²L ELEMENT

[75] Inventors: Koichi Nakayama, Hatoyama; Yoshito Tanaka, Kawagoe, both of Japan

[73] Assignee: Toko, Inc., Tokyo, Japan

[21] Appl. No.: 510,169

[22] Filed: Jul. 1, 1983

[30] Foreign Application Priority Data

Jul. 6, 1982 [JP] Japan ............................... 57-116169
Feb. 28, 1983 [JP] Japan ............................ 58-28485[U]

[51] Int. Cl.[4] ...................... H03K 3/033; H03K 5/04; H03K 19/091
[52] U.S. Cl. .................................. 307/268; 307/265; 307/273
[58] Field of Search ............... 307/260, 265, 267, 268, 307/273

[56] References Cited

U.S. PATENT DOCUMENTS 3,371,248 2/1968 Schatz ................... 307/273
3,772,535 11/1973 Tuten ................... 307/273

Primary Examiner—John Zazworsky
Attorney, Agent, or Firm—Stevens, Davis, Miller & Mosher

[57] ABSTRACT

In a waveform shaping circuit, there are provided a first and a second monostable multivibrator comprising I²L elements. The first and second monostable multivibrators include a first and a second capacitor, respectively. When trigger pulse is simultaneously applied to the first and second monostable multivibrators, the first capacitor of the first monostable multivibrator is charged, while the second capacitor of the second monostable multivibrator is prevented from being charged, by means of a signal resulting from the charging at the first capacitor. Upon completion of the charging at the first capacitor, the second capacitor begins to be charged. In this way, an output signal is generated which corresponds, in respect of waveform and pulse width, to a combination of the outputs of the first and second monostable multivibrators.

3 Claims, 7 Drawing Figures

WAVEFORM SHAPING CIRCUIT INCLUDING I²L ELEMENT

BACKGROUND OF THE INVENTION

1. Field Of The Invention

This invention relates to a waveform shaping circuit consisting of I²L (Integrated Injection Logic) elements, and more particularly it pertains to a waveform shaping circuit comprising a combination of monostable multivibrators consisting of I²L elements.

2. Description Of The Prior Art

Recently, efforts have been made toward miniaturization and cost-reduction of electronic equipment, and with a view to achieving this, attempts have been made to construct electronic circuits in the form of one-chip type semiconductor integrated circuits. It is also the recent demand that power consumption in electronic equipment be decreased as much as possible.

Bipolar transistors have predominantly been used in the field of audio equipment, for example, and it has been noted that I²L elements are most useful in that they are easy to achieve an interface with an electronic circuit using bipolar transistors, by virtue of the fact that such elements are of the current-operated nature. It has also been noted that I²L elements can most suitably be employed to constitute logical circuits, waveform shaping circuits or the like.

SUMMARY OF THE INVENTION

Accordingly, it is an object of the present invention to provide a waveform shaping circuit consisting of I²L elements.

Another object of the present invention is to provide a waveform shaping circuit comprising at least two monostable multivibrators each consisting of I²L elements.

A further object of the present invention is to provide a waveform shaping circuit consisting of I²L elements, which is so designed as to operate at a high speed.

A still further object of the present invention is to provide a waveform shaping circuit which is capable of generating a pulse waveform having a desired pulse width with a high accuracy.

Other objects, features and advantages of the present invention will become apparent from the ensuing description taken in conjunction with the accompanying drawings.

DESCRIPTION OF THE PREFERRED EMBODIMENTS

Figure 1:
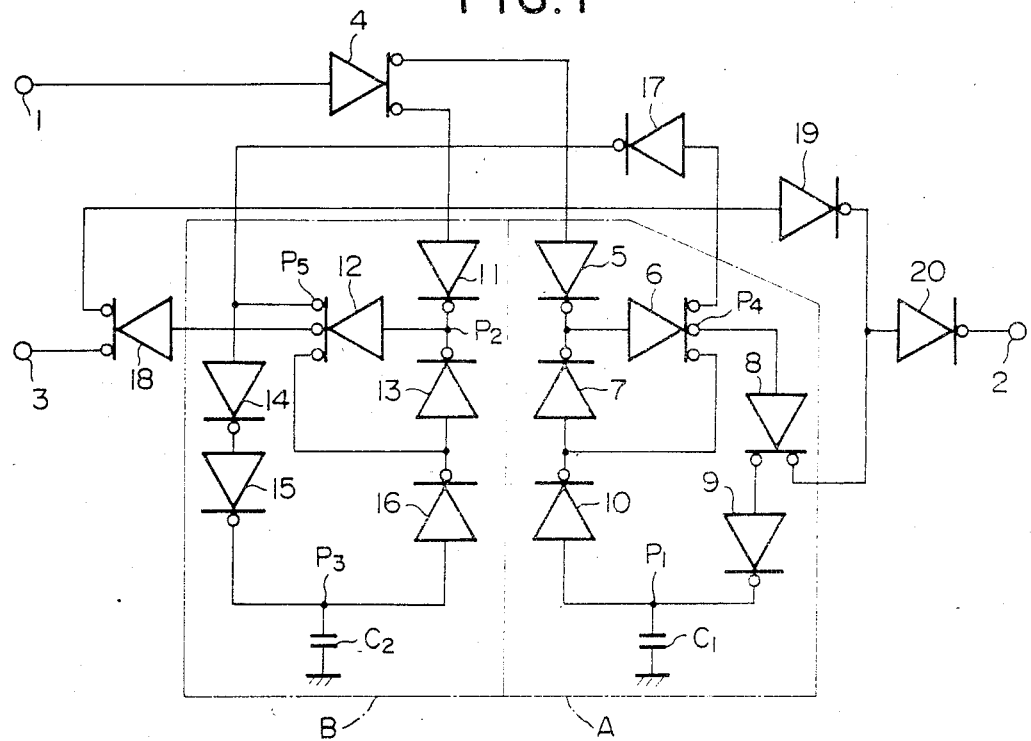
FIG. 1 is a circuit diagram showing the waveform shaping circuit according to an embodiment of the present invention.

Referring to FIG. 1, description will be made of the waveform shaping circuit comprising I²L elements according to an embodiment of the present invention. The circuit shown in FIG. 1 comprises a monostable multivibrator A formed by I²L elements 5 to 10 and a capacitor $C_1$, and another monostable multivibrator B formed by I²L elements 11 to 16 and a capacitor $C_2$. Input terminal 1 of the circuit is connected, through the I²L element 4, to the input terminals of the I²L elements 5 and 11 so that a signal is passed to the monostable multivibrators A and B. In the monostable multivibrator A, the output terminal of the I²L element 5 is connected to the input terminal of the I²L element 6 and the output terminal of the I²L element 7; a first output terminal of the I²L element 6 is connected to the input terminal of the I²L element 7 and the output terminal of the I²L element 10; a second output terminal of the I²L element 6 is connected to the input terminal of the I²L element 8; a first output terminal of the I²L element 8 is connected to the input terminal of the I²L element 9; and the capacitor $C_1$ is connected at one terminal thereof to a connection point between the I²L element 9 and the I²L element 10, and grounded at the other terminal thereof. The monostable multivibrator B, which is constituted by the I²L elements 11 to 16 and capacitor $C_2$ as mentioned above, is identical in construction with the monostable multivibrator A. The monostable multivibrators A and B are connected with each other in the following featured manner: The I²L element 6 of the monostable multivibrator A has a third output terminal thereof connected, via the I²L element 17, to the connection point between a first output terminal of the I²L element 12 and the input terminal of the I²L element 14 in the monostable multivibrator B. A second output terminal of the I²L element 12 is coupled to the input terminal of the I²L element 18 which has a first output terminal thereof connected to an output terminal 3 and a second output terminal thereof to the input 56 terminal of a I²L element 19. The output terminal of the I²L element 19 is connected to the second output terminal of the I²L element 8 and the input terminal of a I²L element 20 which has its output terminal connected to an output terminal 2 of the circuit. The I²L elements 6 and 7 constitute a latch circuit, and so do the I²L element 12 and a I²L element 13.

Figure 2:
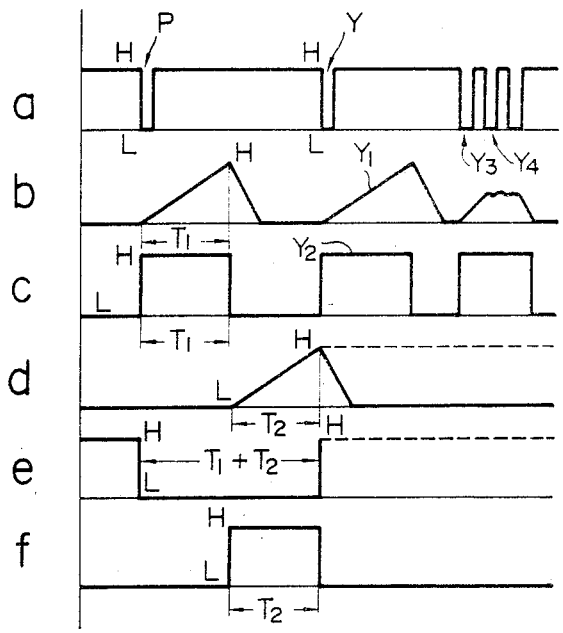
FIG. 2 is a view useful for explaining the operation of the circuit shown in FIG. 1.

The operation of the waveform shaping circuit shown in FIG. 1 will now be described with reference to FIG. 2.

An L-level trigger pulse P shown in FIG. 2a is inputted from the input terminal 1 to a I²L element 4, and an inverted version thereof, i.e., an H-level trigger pulse, which occurs at the output terminal of the I²L element 4, is inputted to the monostable multivibrators A and B. When the H-level trigger pulse is applied to the input terminal of the I²L element 5, the input terminal of the I²L element 6 assumes the L level while the output terminals thereof assume the H level. Thus, the output terminal of the I²L element 8 assumes the L level, and the output terminal of the I²L element 9 assumes the H level. The output terminal of the I²L element 7 is set at the L level since the output terminals of the I²L element 6 are at the H level as mentioned above. Since the output terminal of the I²L element 7 is set at the L level, the output of the I²L element 6 is locked at the H level. When the trigger pulse P is inputted, the potential at the point $P_1$ of the capacitor $C_1$ is inverted from the L level to the H level. That is, the capacitor $C_1$ is discharged so that the potential at the point $P_1$, i.e., at the output terminal of the I²L element 9 is set at the L level. As a result, injector current of the I²L element 10 is caused to flow, as charge current, into the capacitor $C_1$, so that the potential at the point $P_1$ builds up to be the H level, as shown in FIG. 2b, and thus the potential at the output terminal of the I²L element 10 becomes the L level, whereupon the output of the I²L element 7 is inverted from the L level to the H level. In this way, the output of the I²L element 6, which has been kept in the locked state, is inverted from the H level to the L level. Consequently, a waveform having a pulse width equal to the charging time of the capacitor $C_1$ is derived at the output terminal $P_4$ of the I²L element 6. The output of the I²L element 6 is applied, via the I²L element 17, to the point $P_5$ of the monostable multivibrator B.

Description will now be made of the monostable multivibrator B. As in the monostable multivibrator A, when the trigger pulse P is applied to the I²L element 11 through the I²L element 4, the output of the I²L element 11 becomes the L level while the output of the I²L element 12 becomes the H level. However, since the output terminal $P_5$ of the I²L element 12 has been set at the L level, through the I²L element 17, by the monostable multivibrator A, the output of the I²L element 14 becomes the H level, while the output of the I²L element 15 becomes the L level. Further, since the other output terminals of the I²L element 12 are at the H level, the output of the I²L element 13 is set at the L level so that the I²L element 12 is locked. The potential at the point $P_3$ of the capacitor $C_2$ is discharged since the output of the I²L element 15 is set at the L level. When the level at the connection point between the I²L elements 12 and 14 is inverted from the L level to the H level, through the I²L element 17, by the monostable multivibrator A, the output level of the I²L element 14 becomes the L level, while the level at the output terminal of the I²L element 15, i.e., at the point $P_3$ becomes the H level, so that injector current of the I²L element 16 is caused to flow, as charge current, into the capacitor $C_2$. As a result, the potential at the point $P_3$ gradually builds up until it reaches the H level, as shown in FIG. 2d. Thereupon, the output of the I²L element 16 becomes the L level and the output of the I²L element 13 becomes the H level, so that the I²L element 12 is released from the locked state. Since the output of the I²L element 12 is set and held at the H level concurrently with the inputting of the trigger pulse P, the output waveform of the I²L element 18 which occurs at the output terminal 3 will be held at the L level until the potential at the point $P_3$ of the capacitor $C_2$ assumes the H level (FIG. 2e). The period of time during which the output of the I²L element 18 is held at the L level, is equal to the charge time $(T_1+T_2)$ of the capacitors $C_1$ and $C_2$ in the monostable multivibrators A and B. At the output terminal of the I²L element 20, i.e., at the output terminal 2 is derived an output waveform resulting from combination of the output waveform of the I²L elements 18, 19 and the output waveform of the I²L element 8. In this case, the output of the I²L element 19 is at the H level, while the output of the I²L element 8 is at the L level; thus, the output potential of the I²L element 20 depends on the output of the I²L element 8 (FIG. 2f).

In the case where the pulse width which is set up depending on the charge time of the capacitors $C_1$ and $C_2$ is relatively small, the charges at the capacitors $C_1$ and $C_2$ are rapidly discharged through the I²L elements 9 and 15; thus, in such a case, the circuit arrangement shown in FIG. 1 works satisfactorily. However, in the case where the pulse width is great, that is, in the case where the capacitors $C_1$ and $C_2$ have large capacitance values, the circuit arrangement of FIG. 1 tends to suffer malfunction if trigger pulses $Y_3$, $Y_4$ are inputted from the input terminal 1 under such a condition that as indicated by the dotted line in FIG. 2d the charges at the capacitor $C_2$ are not sufficiently discharged through the I²L element 15.

Figure 3:
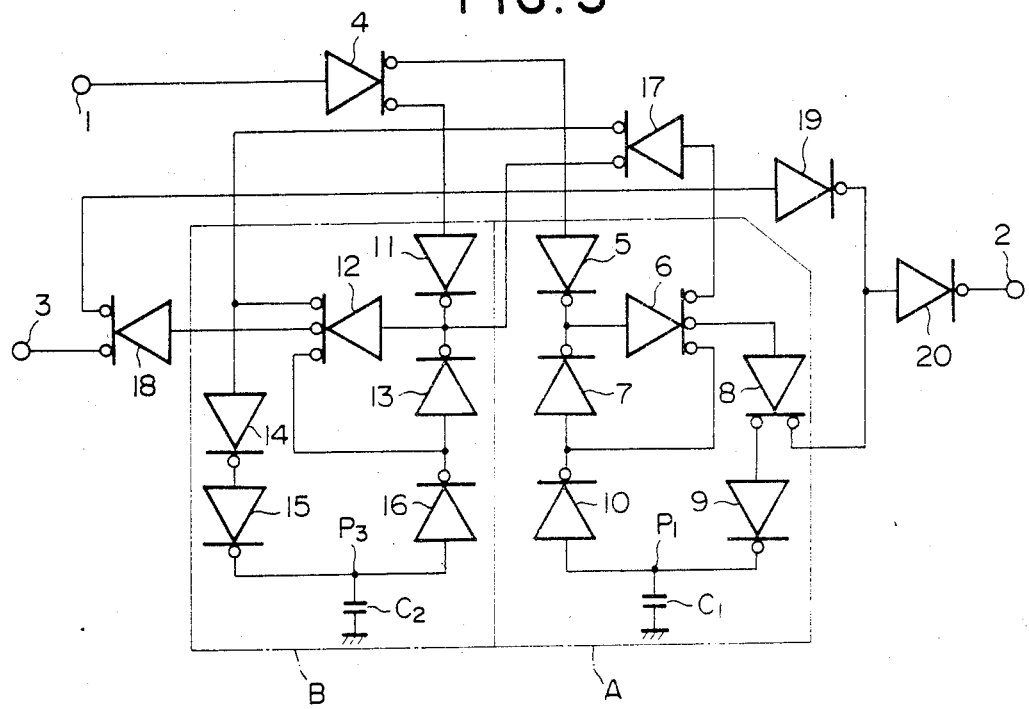
FIG. 3 is a circuit diagram showing the waveform shaping circuit according to a second embodiment of the present invention.
Figure 4:
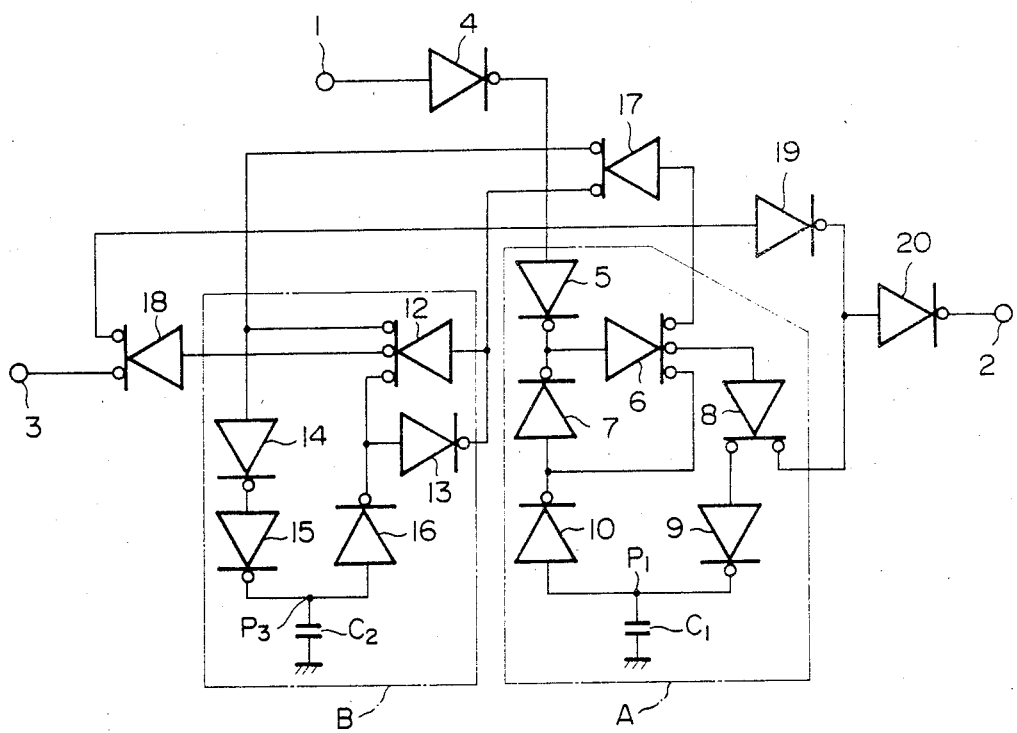
FIG. 4 is a circuit diagram showing the waveform shaping circuit according to a third embodiment of the present invention.

Referring to FIGS. 3 and 4, there are shown the waveform shaping circuits according to a second and a third embodiment of the present invention, respectively, which are so designed as to eliminate the aforementioned problem. In FIGS. 3 and 4, parts corresponding to those of FIG. 1 are indicated by like reference numerals and characters.

The circuit arrangement shown in FIG. 3 is similar to that of FIG. 1, except that the I²L element 17 has a second output terminal coupled to the connection point between the output terminals of the I²L elements 11, 13 and the input terminal of the I²L element 12.

The circuit arrangement shown in FIG. 4 is similar to that of FIG. 3, except that trigger pulse is applied to the monostable multivibrator A through the I²L element 4.

Figure 5:
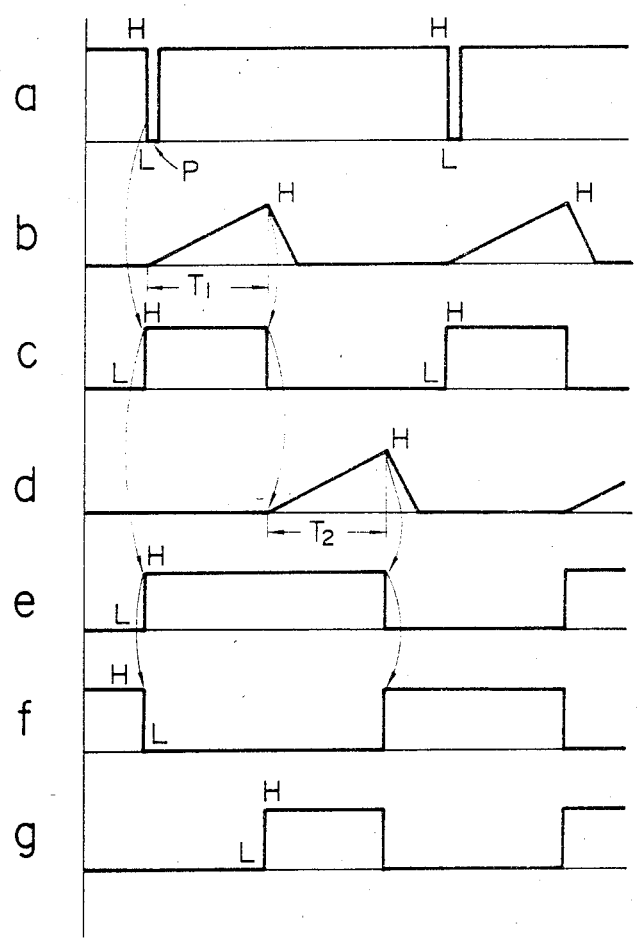
FIG. 5 is a view useful for explaining the operation of the circuits shown in FIGS. 3 and 4.
Figure 6:
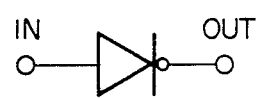
FIG. 6 shows a symbolic mark of I²L element.
Figure 7:
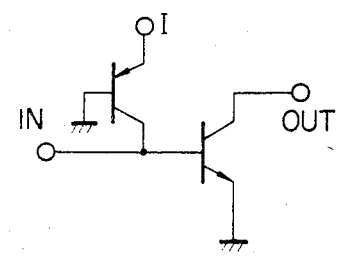
FIG. 7 is an equivalent circuit diagram thereof.

The operation of the waveform shaping circuit shown in FIG. 3 will be described with reference to FIG. 5.

Trigger pulse P such as shown in FIG. 5a is inputted from the input terminal 1 to the monostable multivibrators A and B through the I²L element 4. Thereupon, the latch circuit constituted by the I²L elements 6 and 7 is operated so that the output of the I²L element 6 is inverted from the L level to the H level as shown in FIG. 5c. At this time, injector current of the I²L element 10 is caused to flow to the capacitor $C_1$ so that the latter is charged; thus, the potential level at the point $P_1$ is changed from the L level to the H level (FIG. 5b). The output of the I²L element 6 is inputted to the monostable multivibrator B through the I²L element 17. The I²L element 17 has a first and a second output terminal thereof respectively connected to the input and output terminals of the I²L element 12 which constitutes a latch circuit with the I²L element 13, as mentioned above, in the monostable multivibrator B. The monostable multivibrator A is operated by the trigger pulse P, and at the same time the input terminal of the I² element 12 is forcibly set at the L level, through the I²L element 17, by means of the output of the monostable multivibrator A. As a result, the charges at the capacitor $C_2$ are sufficiently discharged through the I²L element 15 so that the potential at the point $P_3$ is set at the L level. The output of the I²L element 12 is inverted to the H level as shown in FIG. 5e, while the output of the I²L element 18 is inverted to the L level (FIG. 5f). When the capacitor $C_1$ of the monostable multivibrator A assumes the H level, the output level of the I²L element 10 becomes the L level, while the output level of the I²L element 7 becomes the H level; thus, the latch is released, as a result of which the output level of the I²L element 6 becomes the L level (FIG. 5c). Thus, the latch circuit constituted by the I²L elements 12 and 13 in the monostable multlivibrator B is unlatched to ensure that the discharging of the capacitor $C_2$ through the I²L element 15 is initiated. When the potential level at the point $P_3$ of the capacitor $C_2$ becomes the H level, the output of the I²L element 12 is inverted to the L level (FIG. 5e), and thereupon, the output of the I²L element 18 is inverted to the H level (FIG. 5f). Consequently, an output waveform such as shown in FIG. 5g is derived from the output terminal 2.

It is also possible to input trigger pulse to the monostable multivibrator A alone, while at the same time forcibly inputting a signal to the monostable multivibrator B through the I²L element 17, as shown in FIG. 4.

As will be appreciated from the foregoing discussion, the waveform shaping circuit according to the present invention, which is formed by I²L elements, can easily be constructed in the form of a semiconductor integrated circuit.

Furthermore, the output can easily be derived from each of the monostable multivibrators A and B.

Although with each of the foregoing embodiments, an output waveform of the L level having a pulse width equal to the charging time $(T_1+T_2)$ in the monostable multivibrators A and B is derived from the output terminal, it is also possible to obtain an output waveform of the H level having a pulse width equal to $(T_1+T_2)$, by coupling an additional I²L element to the output terminal of the I²L element 20.

Obviously, in order that a I²L element can hold an L-level output at the output terminal thereof, it is required that an external current be drawn in the element.

Another advantage of the present waveform shaping circuit consituted by I²L elements is such that by using a I²L element having a multiple electrode type output terminal, it is possible to take an output out of the element. Using a logical circuit such as waveform shaping circuit consisting of I²L elements, makes it possible to achieve various functions with a relatively simplified circuit arrangement.

As discussed above, the waveform shaping circuit consisting of I²L elements according to the invention is comprised of a first and a second monostable multivibrator, wherein while the first monostable multivibrator is operating, the second monostable multivibrator is maintained in a locked state; and upon completion of the operation of the first monostable multivibrator, the second monostable multivibrator is released from the locked state and operated, whereby an output is produced which corresponds, in respect of waveform and pulse width, to a combination of the outputs of the first and second monostable multivibrators. According to another aspect of the present invention, the design is made such that at the same time as the first monostable multivibrator is operated, the second monostable multivibrator is forcibly locked from operation, and upon completion of the operation of the first monostable multivibrator, the second monostable multivibrator is operated, whereby a waveform having a greater pulse width can be produced with a high accuracy. The pulse width can also be varied as desired.

The circuit arrangement according to the present invention is also advantageous in that since it is comprised mainly of I²L elements, it can readily be fabricated in the form of semiconductor integrated circuit and yet it can be formed in the same semiconductor substrate as other transistors.

While the present invention has been described and illustrated with respect to specific embodiments thereof, it is to be understood that the invention is by no means limited thereto but covers all changes and modifications which will become possible within the scope of the appended claims.

What is claimed is:

1. A waveform shaping circuit, comprising:
a first monostable multivibrator consisting of a first capacitor, said first monostable multi-vibrator including a first latch circuit, said first latch circuit comprising first and second I²L elements, said second I²L element having an output terminal connected to an input terminal of said first I²L element, and a circuit for releasing the action of said first latch circuit, said first latch releasing circuit comprising a third I²L element having an output connected to an output of said first I²L element and an input of said second I²L element; and
a second monostable multivibrator consisting of a second capacitor, said second monostable multivibrator including a second latch circuit, said second latch circuit comprising fourth and fifth I²L elements, said fifth I²L element having an output terminal connected to an input terminal of said fourth I²L element, and a circuit for releasing the action of said second latch circuit, said second latch releasing circuit comprising a sixth I²L element having an output connected to an output of said fourth I²L element and an input of said fifth I²L element;
an output terminal connected to said multivibrators;
wherein when said first monostable multivibrator is operated, the second latch circuit is operated and the circuit for releasing the action of said second latch circuit is prevented from being operated, by means of a signal resulting from the operation of said first monostable multivibrator, thereby preventing said second monostable multivibrator from being operated; and after the operation of said first monostable multivibrator is completed, said second monostable multivibrator is operated, whereby a signal corresponding to a combination of the outputs of said first and second monostable multivibrators is provided as an output signal at said output terminal.

2. A waveform shaping circuit, comprising:
a first monostable multivibrator consisting of I²L elements and a first capacitor;
a second monostable multivibrator consisting of I²L elements and a second capacitor;
means for deriving a first pulse from said first monostable multivibrator by permitting the flowing of injector current (charging current) into said second capacitor to be initiated in response to a trigger pulse applied to said first monostable multivibrator, and also by permitting said first capacitor to be discharged through the first monostable multivibrator I²L elements when a voltage charged at said first capacitor reaches a predetermined level;
means for preventing injector current from flowing in said second capacitor of said second monostable multivibrator while said first pulse is being derived from said first monostable multivibrator; and
means for deriving a second pulse from said second monostable multivibrator in response to release of the action of said means for preventing injector current from flowing in said second capacitor;
whereby a third pulse is generated which corresponds, in respect of pulse width, to a combination of said first and second pulses derived from said first and second monostable multivibrators respectively.

3. A waveform shaping circuit, comprising:

a first monostable multivibrator means for deriving a first pulse including at least a first one I²L element and a first capacitor;
a second monostable multivibator means for deriving a second pulse including at least a second one I²L element and a second capacitor;
said first multivibrator means comprising means, responsive to a trigger pulse, for charging said first capacitor with injector current and means for discharging said first capacitor through said at least a first one I²L element when a charge on said first capacitor reaches a predetermined level;

means for preventing injector current from flowing in said second capacitor while said first pulse is being derived from said first monostable multivibrator means;
said second monostable multivibrator means comprising means, responsive to said injector current preventing means, for deriving a second pulse; and
means, responsive to said first monostable multivibrator means and said second monostable multivibrator means, for generating a third pulse corresponding in pulse width to a combination of said first and second pulses.

* * * * *